US009606175B2

(12) United States Patent
Trethewey et al.

(10) Patent No.: US 9,606,175 B2
(45) Date of Patent: Mar. 28, 2017

(54) REPROGRAMMING A PORT CONTROLLER VIA ITS OWN EXTERNAL PORT

(71) Applicant: Intel Corporation, Santa Clara, CA (US)

(72) Inventors: James R. Trethewey, Hillsboro, OR (US); Peter S. Adamson, Portland, OR (US); John J. Valavi, Beaverton, OR (US); Anantha Narayanan, Ka (IN); Kandasubramaniam K. Palanisamy, Hillsboro, OR (US); Ihab W. Saad, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 145 days.

(21) Appl. No.: 14/583,218

(22) Filed: Dec. 26, 2014

(65) Prior Publication Data

US 2016/0187420 A1    Jun. 30, 2016

(51) Int. Cl.

| | |
|---|---|
| *G06F 11/00* | (2006.01) |
| *G01R 31/3177* | (2006.01) |
| *G01R 31/317* | (2006.01) |
| *G06F 11/22* | (2006.01) |
| *G06F 11/36* | (2006.01) |
| *G06F 11/26* | (2006.01) |

(52) U.S. Cl.
CPC ... *G01R 31/3177* (2013.01); *G01R 31/31705* (2013.01); *G06F 11/2236* (2013.01); *G06F 11/26* (2013.01); *G06F 11/36* (2013.01); *G06F 11/3656* (2013.01)

(58) Field of Classification Search
CPC .. G06F 11/3656; G06F 11/2236; G06F 11/26; G06F 11/36
See application file for complete search history.

(56) References Cited

U.S. PATENT DOCUMENTS 6,126,258 A * 10/2000 Bernard ......... H03K 19/017581
326/63
7,213,172 B2    5/2007 Iovin et al.
7,665,002 B1    2/2010 White et al.
(Continued)

OTHER PUBLICATIONS

USB 3.0 Promoter Group, "Universal Serial Bus Type-C Cable and Connector Specification", Aug. 11, 2014, 171 pages, Revision 1.0.
(Continued)

*Primary Examiner* — Charles Ehne
(74) *Attorney, Agent, or Firm* — Jordan IP Law, LLC

(57) ABSTRACT

Systems and methods may provide for a debug tool including a debug port and a controller including logic to send, via the debug port, a debug mode request to an external port of a target device. Additionally, the target device may include a connector having the external port and a port controller coupled to the external port, wherein the port controller includes logic to detect the debug mode request via the external port, activate a program path between the external port and the port controller in response to the debug mode request, and process one or more commands received via the program path. In one example, the target device further includes a multiplexer coupled to the external port and the port controller, wherein the logic is to send a routing signal to the multiplexer to activate the program path.

20 Claims, 5 Drawing Sheets

(56) References Cited

U.S. PATENT DOCUMENTS

| | | | |
|---|---|---|---|
| 8,074,131 B2 * | 12/2011 | Kurts | G01R 31/31705 703/23 |
| 8,214,653 B1 | 7/2012 | Marr et al. | |
| 2008/0072103 A1 | 3/2008 | Lou | |
| 2009/0222693 A1 * | 9/2009 | Moyer | G06F 11/3656 714/25 |
| 2010/0332927 A1 | 12/2010 | Kurts et al. | |
| 2012/0151264 A1 * | 6/2012 | Balkan | G06F 11/26 714/34 |
| 2015/0278058 A1 * | 10/2015 | Kurts | G06F 11/3476 714/30 |

OTHER PUBLICATIONS

Bob Dunstan et al., "USB Power Delivery Specification", Aug. 11, 2014, 534 pages, Revision 2.0, Version 1.0.
NXP Semiconductors, "UM10204 I2C-bus Specification and user manual", User manual, Apr. 4, 2014, 64 pages, Revision 6, NXP Semiconductors N.V.
Trenton Henry et al., "Universal Serial Bus Device Class Specification for Device Firmware Upgrade", Aug. 5, 2004, 47 pages, (Revision) Version 1.1.
Fred Bhesania, "HID Over I2C Protocol Specification", Apr. 24, 2004, 66 pages, Version 1.00, Microsoft Corporation.
D. Cooper et al., "Internet X.509 Public Key Infrastructure Certificate and Certificate Revocation List (CRL) Profile", May 2008, 151 pages, Standard Track.
International Search Report and Written Opinion for PCT Patent Application No. PCT/US2015/066231, mailed Mar. 29, 2016, 13 pages.

* cited by examiner

US 9,606,175 B2

REPROGRAMMING A PORT CONTROLLER VIA ITS OWN EXTERNAL PORT

TECHNICAL FIELD

Embodiments generally relate to port controller updates. More particularly, embodiments relate to reprogramming port controllers via their own external ports.

BACKGROUND

Interfaces such as USB (Universal Serial Bus) Type-C (e.g., Universal Serial Bus Type-C Cable and Connector Specification, Rev. 1.0, Aug. 11, 2014, USB Implementers Forum) interfaces may enable various computing components to exchange information and power with one another. A typical USB Type-C interface may include a port controller chip and a connector having an outward facing (e.g., relative to the device containing the connector) external port/receptacle with a subset of pins that are electrically coupled to the port controller chip. Upgrading such an interface may involve reprogramming the port controller chip with new firmware. While conventional approaches to conducting the upgrade may be suitable under certain circumstances, there remains considerable room for improvement.

For example, one approach may include plugging a specialized tool into a JTAG (Joint Test Action Group) port that is laterally facing and positioned internal to the chassis of the device containing the interface, wherein the tool may run application software that programs new firmware into the port controller chip. Such a solution may be time consuming, inconvenient and costly due to the process of opening the device chassis in order to access the JTAG port. Another approach may run a device firmware update (DFU) software application on a host processor of the device itself, wherein the DFU software application programs new firmware into the port controller chip. If, however, the device is unbootable, lacks power or is infected with malware, such a solution may be unsuitable.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
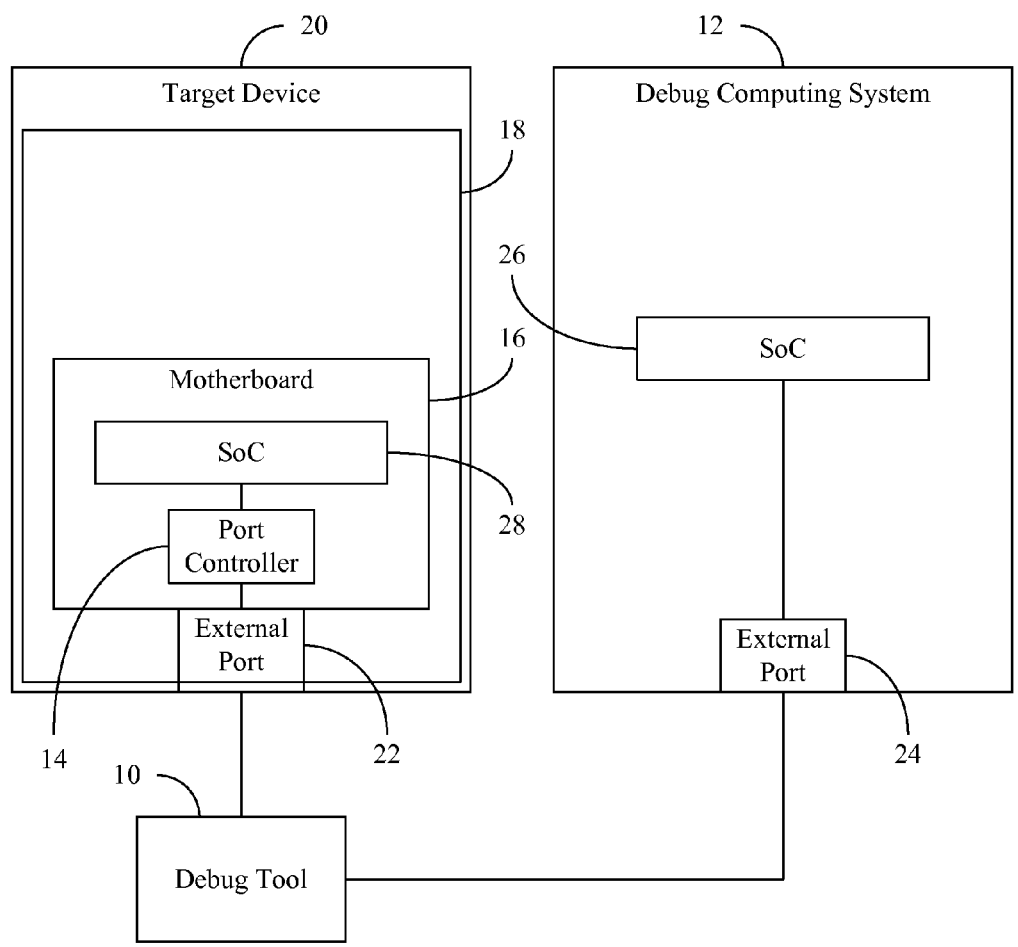
FIG. 1 is a block diagram of an example of a port reprogramming configuration according to an embodiment.

Turning now to FIG. 1, a port reprogramming configuration is shown in which a debug tool 10 and a debug computing system 12 are used to reprogram a port controller 14. In general, the port controller 14 may be mounted on a motherboard 16 or other appropriate circuit board and/or subsystem contained within a chassis 18 of a reprogrammable target device 20 (e.g., server, desktop computer, notebook computer, tablet computer, convertible tablet, smart phone, personal digital assistant/PDA, mobile Internet device/MID, media player, wearable computer, etc.). In the illustrated example, the port controller 14 is electrically coupled to an external port 22 (e.g., receptacle) that faces outward from the target device 20 and is accessible by the debug tool 10 without opening the chassis 18 of the target device 20. In one example, the external port 22 and the port controller 14 constitute a USB Type-C interface.

As will be discussed in greater detail, the debug tool 10 may be readily coupled to the external port 22 of the target device and an external port 24 of the debug computing system 12, wherein a device firmware update (DFU) application running on a system on chip (SoC) 26 (e.g., host processor, chipset, input/output module) of the debug computing system 12 may direct/control the reprogramming of the port controller 14 via the debug tool 10 and the external port 22. Thus, the illustrated approach may provide a fast, convenient and inexpensive solution to reprogramming the port controller 14 that does not involve opening the chassis 18 or running a DFU on the SoC 28 of the target device 20. The debug tool 10 may also be used to diagnose the SoC 28 and/or other subsystem of the target device 20 without opening the chassis 18.

Figure 2:
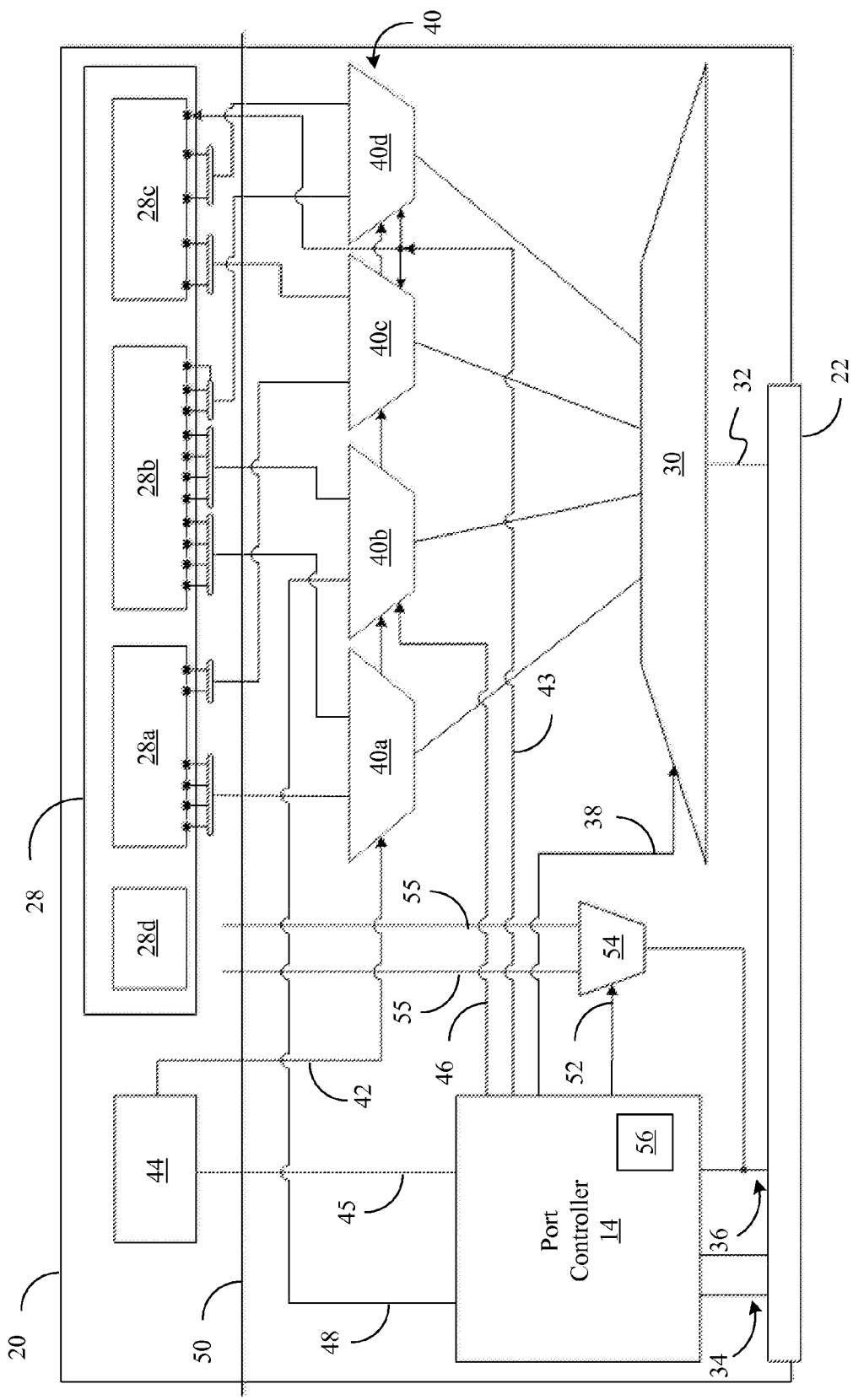
FIG. 2 is a schematic diagram of an example of a reprogrammable target device according to an embodiment.

FIG. 2 shows one example of the target device 20 in greater detail. In the illustrated example, the external port 22 includes a set of configuration channel contacts 34 (e.g., CC1, CC2), a voltage bus contact 36 (e.g., Vbus) and a set of remaining contacts 32 coupled to a cable orientation multiplexer 30 (MUX). During operation, the port controller 14 may monitor, using analog to digital (A/D) conversion and/or voltage comparators (not shown), the set of configuration channel contacts 34 in order to determine whether the target device 20 will act as a "host" or "device" relative to another port (e.g., a "port partner", not shown) that is mated with the external port 22. The port controller 14 may also use the set of configuration channel contacts 34 to determine the orientation of the port partner, and use a cable orientation select signal 38 to control the cable orientation multiplexer 30 so that the set of remaining contacts 32 appear to be "right side up" to circuitry above the multiplexer 30 such as, for example, the SoC 28. Of particular note is that the set of remaining contacts 32 do not terminate at the port controller 14, in the illustrated example.

A set of alternate mode multiplexers 40 (40a-40d) may be coupled to the cable orientation multiplexer 30, wherein the set of alternate mode multiplexers 40 may generally route signals from the set of remaining contacts 32 to components of the SoC 28 (28a-28d) based on an alternate mode select signal 42 from a policy engine 44 and/or an audio accessory select signal 43 from the port controller 14. For example, a first SoC component 28a might include a USB controller host port, a second SoC component 28b may include a DISPLAYPORT controller source port, a third SoC component 28c might include an audio codec, a fourth SoC component 28d may include a host processor, and so forth, wherein during normal operation, communications between the target device 20 and the port partner may involve various combinations of the components of the SoC depending on the alternate mode select signal 42 and/or the audio accessory select signal 43.

The policy engine 44 may alternatively be embedded in the port controller 14. Such an approach may enable elimination of a communication link 45 between the policy engine 44 and the port controller 14 and provide isolation of the policy engine 44 from malware potentially running on the SoC 28. The illustrated location of the policy engine 44, on the other hand, may enable real-time policy control/modification by software running on the SoC 28.

Additionally, the target device 20 may be partitioned by a power island dividing line 50 so that all circuitry below the line 50 has a dedicated voltage regulator (not shown) that enables the circuitry to power up from either power provided by an internal power source located inside the chassis 18 (FIG. 1) of the target device 20 or by an external power source of, for example, a debug tool, provided on the voltage bus contact 36 of the external port 22. Thus, the illustrated port controller 14 is able to power up, operate and be re-programmed even when the target device 20 lacks internal power (e.g., dead battery). In this regard, the port controller 14 may also assert a power select signal 52 to a power switch 54 in order to permit electrical current to flow into our out of the motherboard 16 (FIG. 1). The target device 20 may also be configured with the appropriate power rail 55 routing and/or voltage regulation to enable circuitry above the dividing line 50 to be powered by the external power source.

In the illustrated example, the port controller 14 detects a debug mode request via the external port 22 and asserts a routing signal 46 to an alternate mode multiplexer 40b in order to activate a program path 48 between the external port 22 and the port controller 14. Accordingly, the port controller 14 may selectively receive commands and/or code via the program path 48, which bypasses the fourth SoC component 28d (e.g., host processor) and the other components of the SoC 28. The commands may include, for example, reprogram commands, reset commands, diagnostic commands, etc., and the code may include runtime firmware images, debug bootloaders, etc. As will be discussed in greater detail, the port controller 14 may store the code to non-volatile memory (NVM) 56 associated with the port controller 14.

Turning now to FIGS. 3A to 3D, non-volatile memory sections are shown in various different configurations. Each of the illustrated memory sections may be readily substituted for the NVM 56 (FIG. 2). In general, the non-volatile memory (e.g., flash) of the port controller may be divided into non-overlapping regions called "sections", wherein the sections may be contiguous or non-contiguous. Each section may have attributes, including but not limited to: start address (e.g., where in memory it begins); length (e.g., how many bytes of memory it occupies); access rights (e.g., controlling how the section may be used by software), and so forth.

The access rights of the section may include but are not limited to: read (e.g., the DFU software may read-out the contents of the section); write (e.g., the DFU software may re-program the contents of the section); execute (e.g., the section contains valid code that may be executed), etc. Additionally, the port controller protocol may use a short-hand representation of these access rights such as "rwx" (read, write, and execute), wherein any unavailable access right may be replaced with a hyphen, such as "rw-" (read, write, but not executable).

Figure 3:
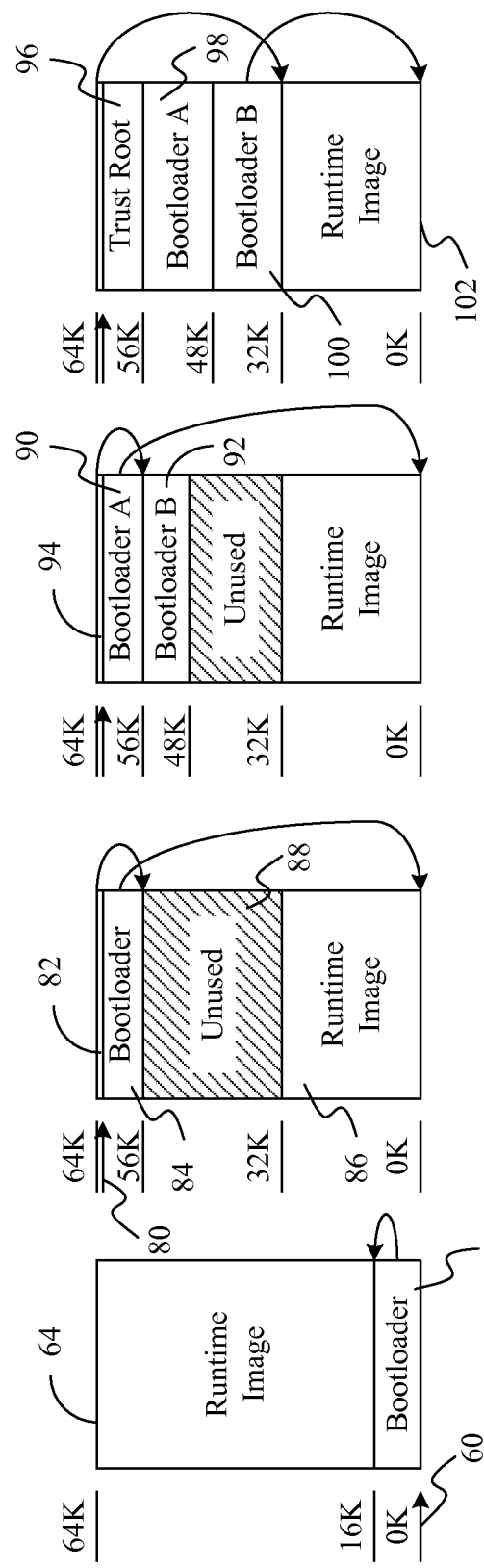
FIGS. 3A to 3D are illustrations of examples of memory sections according to embodiments.

With specific reference to FIG. 3A, the port controller may begin execution at address 0 K upon detecting a reset 60. The illustrated memory is divided into two Sections: a bootloader section 62 that may be executed first after the reset 60; and a runtime image section 64 that contains firmware that operates the port controller (e.g., in accordance with interface specifications).

Figure 4:
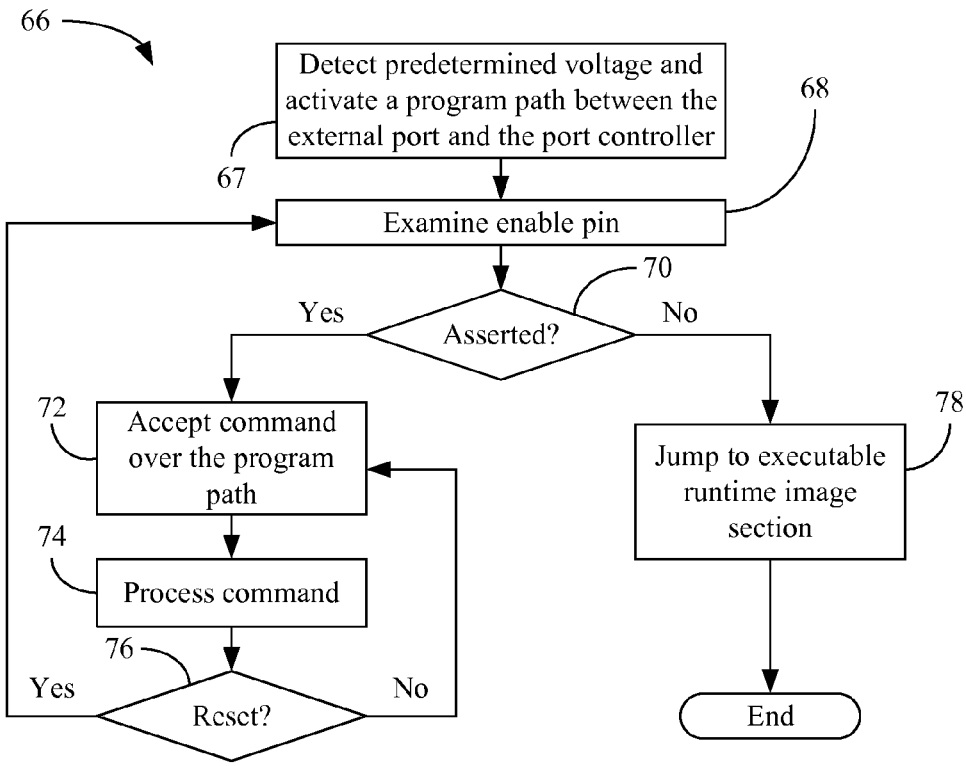
FIG. 4 is a flowchart of an example of a method of operating a port controller according to an embodiment.

FIG. 4 shows a method 66 of operating a port controller. The method 66 may be implemented in one or more bootloader modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof. For example, computer program code to carry out operations shown in method 66 may be written in any combination of one or more programming languages, including an object oriented programming language such as JAVA, SMALLTALK, C++ or the like and conventional procedural programming languages, such as the "C" programming language or similar programming languages.

Illustrated block 67 provides for detecting a predetermined voltage and/or resistance on configuration channel contacts such as, for example, the set of configuration channel contacts 34 (FIG. 2) and activating a program path such as, for example, the program path 48 (FIG. 2), between the external port and the port controller. As will be discussed in greater detail, the predetermined voltage may be indicative of a particular resistor (e.g., Rd) being coupled to each of the configuration channel contacts in the port partner. Block 68 may examine an enable pin/contact of the external port. If it is determined at block 70 that an enable signal is asserted on the enable pin, the port controller may determine that a debug mode request is being issued by the port partner. In such a case, block 72 may accept a command over the program path, wherein the command may be processed at block 74. The command may include, for example, a reprogram command, a reset command, a diagnostic command, etc., or any combination thereof. A reprogram command, for example, might provide for modifying any section that has write access. In one example, the bootloader section has an access right of "--x" and may therefore be executed but not read or written.

A determination may be made at block 76 as to whether the command is a reset command. If not, the next command is accepted over the program path at illustrated block 72. Otherwise, the method 66 may return to block 68 and examine the enable pin. If it is determined at block 70 that an enable signal is not asserted on the enable pin (e.g., the port partner has completed the reprogramming/diagnostics), a jump to the executable runtime image section may be performed at block 78. The runtime image section may contain the firmware used by the port controller during normal operation. In one example, the runtime image section has an access right of "rwx" and may therefore be read (e.g., for making backup copies), written (e.g., reprogrammed) and executed.

Returning now to FIG. 3B, execution may alternatively begin at an address called a reset vector 80, which is part of a reset and interrupt vectors section 82. The reset vector 80 may contain the address (or a "JUMP" instruction and an address) where execution continues, in this case at the beginning of a bootloader section 84. The bootloader section 84 may implement a method such as, for example, the method 66 (FIG. 4), already discussed. Thus, if the enable signal is asserted, the contents of a runtime image section 86 may be reprogrammed. Otherwise, the bootloader section 84 may jump execution to the beginning of the runtime image section 86. Accordingly, this example shows that some sections may be non-contiguous, as indicated by an unused space 88 separating the bootloader section 84 from the runtime image section 86.

FIG. 3C demonstrates that the bootloader itself may be reprogrammable (e.g., has access rights of "-wx" instead of "--x") in the event that it needs to be upgraded (e.g., due to new features or errata corrections). To prevent against corrupting the bootloader (for example, a power failure occurs in the midst of reprogramming), two separate copies termed "bootloader A" section 90 and "bootloader B" section 92 may be defined. Initially, the reset and interrupt vectors section 94 may point to the bootloader A section 90 with access rights -wx and not to the bootloader B section 92 with access rights -w- (e.g., not executable).

If and when the bootloader needs to be upgraded, the new bootloader image may be programmed into the bootloader B section 92. If a corruption occurs during this phase, there is still valid and executable code in the bootloader A section 90 that may be reverted to. Only after successful/complete/verified reprogramming, the bootloader B section 92 may be marked with access rights "-wx", bootloader A section 90 may be re-marked with access rights "-w-" and the reset vector may be updated to point to bootloader B instead of bootloader A. Now the bootloader A section 90 may also be re-programmed. If a corruption occurs during this phase, there is already valid and executable code in the bootloader B section 92 that will run.

Turning now to FIG. 3D, a "secure DFU" scenario is shown. In the illustrated example, a trust root section 96 with access rights "--x" may be installable by the system manufacturer only using JTAG. Thus, the trust root section 96 may contain code that can verify digital signatures associated with each section to be programmed, such as a bootloader A section 98, a bootloader B section 100, and/or a runtime image section 102. In the secure DFU model, reprogramming of any section may only be permitted if both the access right is writable and the new image has a valid digital signature. The bootloader(s) may use secured code function calls to the trust root section 96 to perform the actual signature verification. In some embodiments, the trust root section 96 may be physically located in a separate peripheral device such as, for example, a trusted platform module (TPM)

In some embodiments, the manufacturer of the port controller may provide a vendor-proprietary bootloader in lieu of a DFU bootloader. The vendor's bootloader is often in non-reprogrammable memory such as "masked ROM". The vendor may define an expected type of interface port such as, for example, USB, I²C (Inter-Integrated Circuit, e.g., I²C Specification UM10204, Rev. 03, Jun. 19, 2007, NXP Semiconductors), SPI (Serial Peripheral Interface), UART (Universal Asynchronous Receiver/Transmitter), and so forth. In such cases, the debug tool 10 (FIG. 1) may be replaced with a tool provided by the vendor, or merely an appropriate cable routed back to the debug computing system 12 (FIG. 1).

Figure 5:
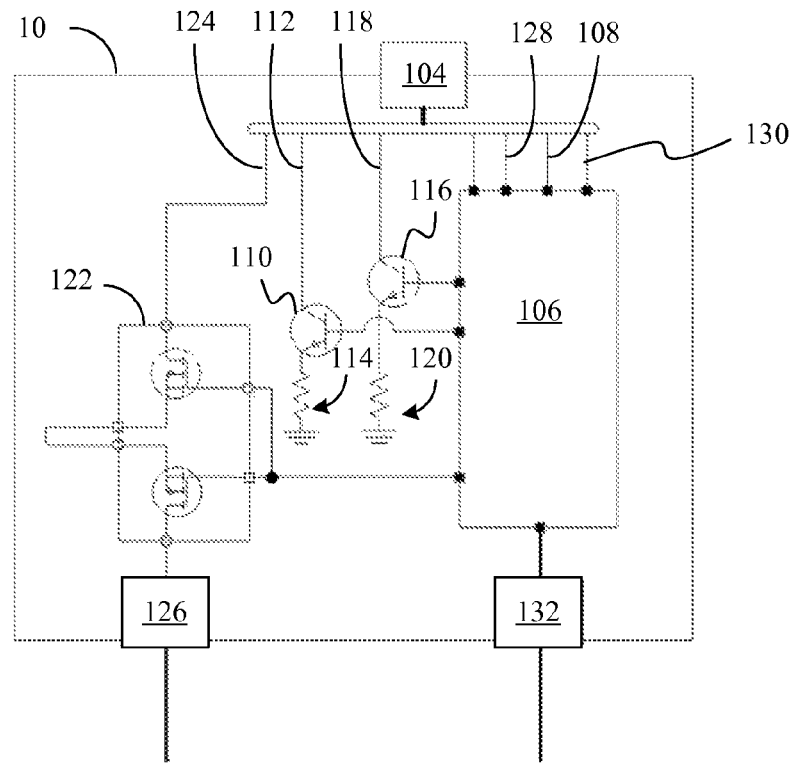
FIG. 5 is a schematic diagram of an example of a debug tool according to an embodiment.

FIG. 5 shows one example of the debug tool 10 in greater detail. In general, the debug tool 10 may include a debug port 104 and a controller 106 having logic to send, via the debug port 104, a debug mode request to an external port of a target device such as, for example, the target device 20 (FIGS. 1 and 2). More particularly, the logic of the controller 106 may assert an enable signal via an enable contact 108 to the debug port 104, apply a predetermined resistance to the debug port 104 and apply power to the debug port 104. For example, a first switch 110 may be coupled to a first configuration channel (CC1) contact 112 of the debug port 104 and a first resistor 114 (e.g., Rd) may be coupled to the first switch 110, wherein the logic of the controller 106 may activate (e.g., pull down) the first switch 110 to apply the predetermined resistance to the debug port 104. Similarly, a second switch 116 may be coupled to a second configuration channel (CC2) contact 118 and a second resistor 120 (e.g., Rd) may be coupled to the second switch 116, wherein the logic of the controller 106 may activate (e.g., pull down) the second switch 116 to apply the predetermined resistance to the debug port 104.

The illustrated debug tool 10 also includes a set of power transistors 122 coupled to a voltage bus contact 124 of the debug port 104 and a power port 126 coupled to the set of power transistors 122. When the power port 126 is coupled to a power source, the logic of the controller 106 may therefore activate the set of power transistors 122 to apply power to the debug port 104. Applying power to the debug port 104 may therefore enable the debug tool 10 to drive sufficient power to run circuitry below a target device power island dividing line such as, for example, the dividing line 50 (FIG. 2), already discussed. The logic of the controller 106 may also send, via a serial data contact 128 (e.g., DFU_SDA) of the debug port 104, one or more commands and/or code (e.g., runtime firmware image, debug bootloader) to the external port of the target device, wherein the one or more commands may include a reprogram command, a diagnostic command, etc., or any combination thereof. Additionally, the logic of the controller 106 may send, via a reset contact 130 (e.g., DFU_RESET#) of the debug port 104, a reset command to the external port of the target device. The commands may be received from a debug computing system such as, for example, the system 12 (FIG. 1), via an external port 132. Alternatively, the debug tool 10 may be incorporated within the debug computing system, as already noted.

Figure 6:
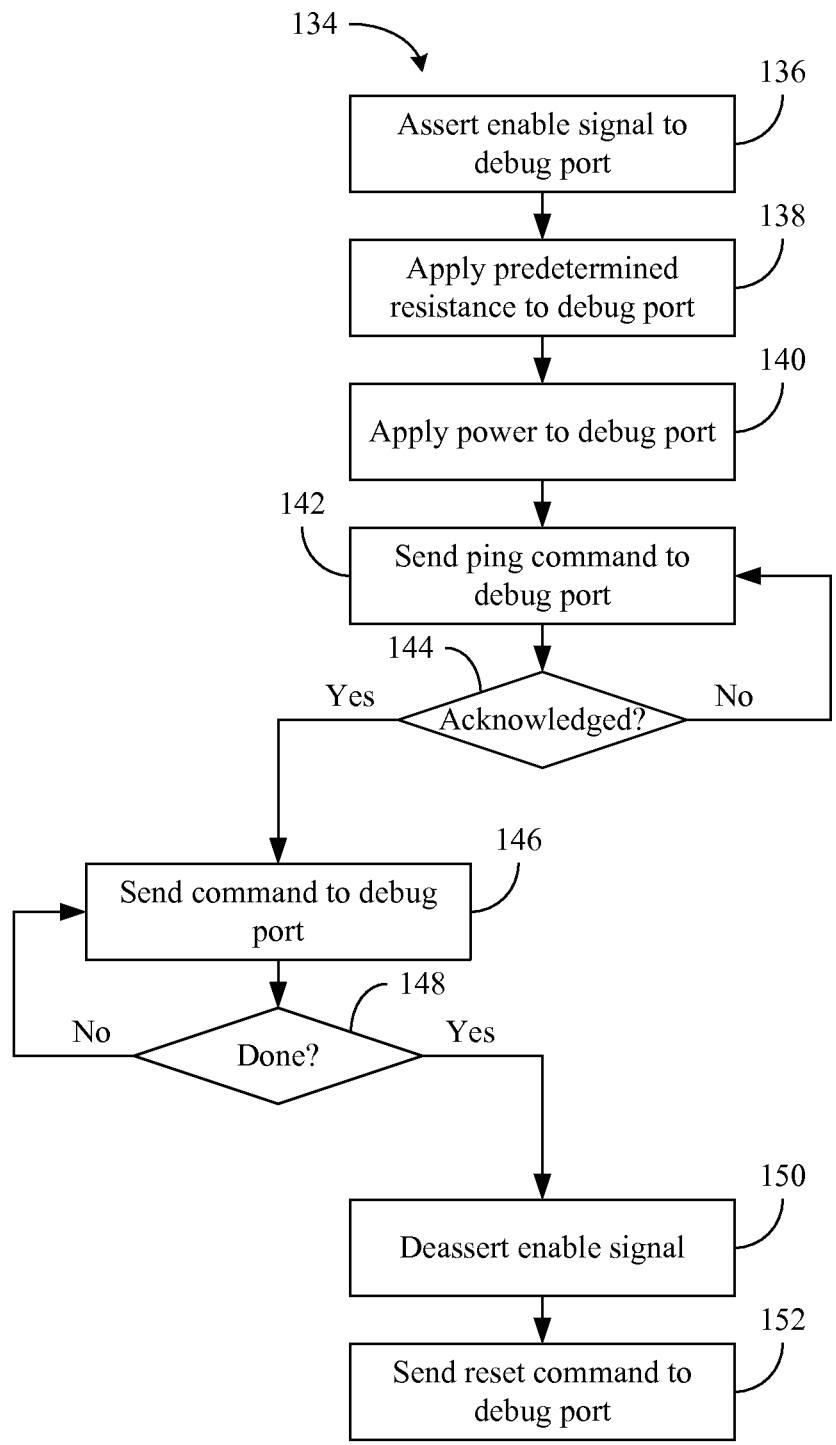
FIG. 6 is a flowchart of an example of a method of operating a debug tool according to an embodiment.

Turning now to FIG. 6, a method 134 of operating a debug tool is shown. The method 134 may be implemented in one or more debug controller modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof. Illustrated processing block 136 provides for asserting an enable signal to a debug port of the debug tool, wherein a predetermined resistance may be applied to the debug port at block 138. Additionally, illustrated block 140 applies power to the debug port. Accordingly, blocks 136, 138 and 140 may provide for sending a debug mode request to an external port of a target device.

An arbitrary ping command may be sent to the debug port at block 142, wherein illustrated block 144 determines whether the ping command has been acknowledged by the target device. If not, the ping command may be resent at block 142. Otherwise, the opening of the communication program path to the port controller has been verified and block 146 may send a command to the debug port. The command may include, for example, a reprogram command, a diagnostic command, etc., or any combination thereof. Thus, the command may provide for a variety of debugging actions such as, for example, reading/writing registers inside other component chips, inspecting memory, setting breakpoints, single stepping, etc. Illustrated block 148 determines whether the command transmission sequence is done. If not, the next command may be sent to the debug port at block 146. When the command transmission sequence is done, block 150 may deassert the enable signal and illustrated block 152 sends a reset command to the debug port.

Additional Notes and Examples

Example 1 may include a reprogrammable target device comprising a connector including an external port and a port controller, the port controller including logic to detect a debug mode request via the external port, activate a program path between the external port and the port controller in response to the debug mode request, and process one or more commands received via the program path.

Example 2 may include the device of Example 1, further including a multiplexer coupled to the external port and the port controller, wherein the logic is to send a routing signal to the multiplexer to activate the program path.

Example 3 may include the device of Example 1, further including a host processor, wherein the program path bypasses the host processor.

Example 4 may include the device of Example 1, wherein the one or more commands are to be processed using power that is external to the device.

Example 5 may include the device of Example 1, further including non-volatile memory associated with the port controller, wherein the logic is to receive code via the program path, wherein the code is to include one or more of a runtime firmware image or a debug bootloader, and store the code to the non-volatile memory.

Example 6 may include the device of any one of Examples 1 to 5, wherein the one or more commands are to include one or more of a reprogram command, a reset command or a diagnostic command.

Example 7 may include a debug tool comprising a debug port and a controller including logic to send, via the debug port, a debug mode request to an external port of a target device.

Example 8 may include the debug tool of Example 7, wherein, to send the debug mode request, the logic is to assert an enable signal to the debug port, apply a predetermined resistance to the debug port, and apply power to the debug port.

Example 9 may include the debug tool of Example 8, further including a first switch coupled to a first configuration channel contact of the debug port, a first resistor coupled to the first switch, a second switch coupled to a second configuration channel contact of the debug port, and a second resistor coupled to the second switch, wherein the logic is to activate the first switch and the second switch to apply the predetermined resistance to the debug port.

Example 10 may include the debug tool of Example 7, further including a set of power transistors coupled to a voltage bus contact of the debug port, and a power port coupled to the set of power transistors, wherein the logic is to activate the set of power transistors to apply power to the debug port.

Example 11 may include the debug tool of any one of Examples 7 to 10, wherein the logic is to send, via the debug port, one or more commands to the external port of the target device, wherein the one or more commands include one or more of a reprogram command, a reset command or a diagnostic command.

Example 12 may include the debug tool of any one of Examples 7 to 10, wherein the logic is to send, via the debug port, code to the external port of the target device, wherein the code includes one of a runtime firmware image or a debug bootloader.

Example 13 may include a method of operating a port controller, comprising detecting, at the port controller, a debug mode request via an external port of a connector, activating a program path between the external port and the port controller in response to the debug mode request, and processing, at the port controller, one or more commands received via the program path.

Example 14 may include the method of Example 13, wherein activating the program path includes sending a routing signal to a multiplexer coupled to the external port.

Example 15 may include the method of Example 13, wherein the program path bypasses a host processor of a target device containing the port controller.

Example 16 may include the method of Example 13, wherein the one or more commands are processed using power that is external to a target device containing the port controller.

Example 17 may include the method of Example 13, further including receiving code via the program path, wherein the code includes one or more of a runtime firmware image or a debug bootloader, and storing the code to non-volatile memory associated with the port controller.

Example 18 may include the method of any one of Examples 13 to 17, wherein the one or more commands include one or more of a reprogram command, a reset command or a diagnostic command.

Example 19 may include at least one non-transitory computer readable storage medium comprising a set of instructions which, when executed by a port controller, cause the port controller to detect a debug mode request via an external port of a connector, activate a program path between the external port and the port controller in response to the debug mode request, and process one or more commands received via the program path.

Example 20 may include the at least one non-transitory computer readable storage medium of Example 19, wherein the instructions, when executed, cause the port controller to send a routing signal to a multiplexer coupled to the external port to activate the program path.

Example 21 may include the at least one non-transitory computer readable storage medium of Example 19, wherein the program path is to bypass a host processor of a target device containing the port controller.

Example 22 may include the at least one non-transitory computer readable storage medium of Example 19, wherein the one or more commands are to be processed using power that is external to a target device containing the port controller.

Example 23 may include the at least one non-transitory computer readable storage medium of Example 19, wherein the instructions, when executed, cause the port controller to receive code via the program path, wherein the code is to include one or more of a runtime firmware image or a debug bootloader, and store the code to non-volatile memory associated with the port controller.

Example 24 may include the at least one non-transitory computer readable storage medium of any one of Examples 19 to 23, wherein the one or more commands are to include one or more of a reprogram command, a reset command or a diagnostic command.

Example 25 may include a debug tool comprising means for detecting, at the port controller, a debug mode request via an external port of a connector, means for activating a program path between the external port and the port controller in response to the debug mode request, and means for processing, at the port controller, one or more commands received via the program path.

Example 26 may include the debug tool of Example 25, wherein the means for activating the program path includes means for sending a routing signal to a multiplexer coupled to the external port.

Example 27 may include the debug tool of Example 25, wherein the program path is to bypass a host processor of a target device containing the port controller.

Example 28 may include the debug tool of Example 25, wherein the one or more commands are to be processed using power that is external to a target device containing the port controller.

Example 29 may include the debug tool of Example 25, further including means for receiving code via the program path, wherein the code is to include one or more of a runtime firmware image or a debug bootloader, and means for storing the code to non-volatile memory associated with the port controller.

Example 30 may include the debug tool of any one of Examples 25 to 29, wherein the one or more commands are to include one or more of a reprogram command, a reset command or a diagnostic command.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A device comprising:
   a connector including an external port;
   a port controller including logic to:
      detect a debug mode request via the external port,
      activate a program path between the external port and the port controller in response to the debug mode request, and
      process one or more commands received via the program path; and
   a multiplexer coupled to the external port and the port controller, wherein the logic is to send a routing signal to the multiplexer to activate the program path.

2. The device of claim 1, further including a host processor, wherein the program path bypasses the host processor.

3. The device of claim 1, wherein the one or more commands are to be processed while the device lacks internal power.

4. A device comprising:
   a connector including an external port;
   a port controller including logic to:
      detect a debug mode request via the external port,
      activate a program path between the external port and the port controller in response to the debug mode request, and
   process one or more commands received via the program path; and
   non-volatile memory associated with the port controller, wherein the logic is to:
      receive code via the program path, wherein the code is to include one or more of a runtime firmware image or a debug bootloader; and
      store the code to the non-volatile memory.

5. The device of claim 1, wherein the one or more commands are to include one or more of a reprogram command, a reset command or a diagnostic command.

6. A debug tool comprising:
   a debug port; and
   a controller including logic to send, via the debug port, a debug mode request to an external port of a target device wherein, to send the debug mode request, the logic is to:
   assert an enable signal to the debug port;
   apply a predetermined resistance to the debug port; and
   apply power to the debug port.

7. A debug tool comprising:
   a debug port; and
   a controller including logic to send, via the debug port, a debug mode request to an external port of a target device;
   a first switch coupled to a first configuration channel contact of the debug port;
   a first resistor coupled to the first switch;
   a second switch coupled to a second configuration channel contact of the debug port; and a second resistor coupled to the second switch, wherein the logic is to activate the first switch and the second switch to apply the predetermined resistance to the debug port.

8. The debug tool of claim 6, further including:
a set of power transistors coupled to a voltage bus contact of the debug port; and
a power port coupled to the set of power transistors, wherein the logic is to activate the set of power transistors to apply power to the debug port.

9. The debug tool of claim 6, wherein the logic is to send, via the debug port, one or more commands to the external port of the target device, wherein the one or more commands include one or more of a reprogram command, a reset command or a diagnostic command.

10. A debug tool comprising:
a debug port; and
a controller including logic to send, via the debug port, a debug mode request to an external port of a target device, wherein the logic is to send, via the debug port, code to the external port of the target device, wherein the code includes one of a runtime firmware image or a debug bootloader.

11. A method of operating a port controller, comprising:
detecting, at the port controller, a debug mode request via an external port of a connector;
activating a program path between the external port and the port controller in response to the debug mode request, wherein activating the program path includes sending a routing signal to a multiplexer coupled to the external port; and
processing, at the port controller, one or more commands received via the program path.

12. The method of claim 11, wherein the program path bypasses a host processor of a target device containing the port controller.

13. The method of claim 11, wherein the one or more commands are processed while a target device containing the port controller lacks internal power.

14. A method of operating a port controller, comprising:
detecting, at the port controller, a debug mode request via an external port of a connector;
activating a program path between the external port and the port controller in response to the debug mode request; and
processing, at the port controller, one or more commands received via the program path;
receiving code via the program path, wherein the code includes one or more of a runtime firmware image or a debug bootloader; and
storing the code to non-volatile memory associated with the port controller.

15. The method of claim 11, wherein the one or more commands include one or more of a reprogram command, a reset command or a diagnostic command.

16. At least one non-transitory computer readable storage medium comprising a set of instructions which, when executed by a port controller, cause the port controller to:
detect a debug mode request via an external port of a connector;
activate a program path between the external port and the port controller in response to the debug mode request;
process one or more commands received via the program path; and
send a routing signal to a multiplexer coupled to the external port to activate the program path.

17. The at least one non-transitory computer readable storage medium of claim 16, wherein the program path is to bypass a host processor of a target device containing the port controller.

18. The at least one non-transitory computer readable storage medium of claim 16, wherein the one or more commands are to be processed while a target device containing the port controller lacks internal power.

19. At least one non-transitory computer readable storage medium comprising a set of instructions which, when executed by a port controller, cause the port controller to:
detect a debug mode request via an external port of a connector;
activate a program path between the external port and the port controller in response to the debug mode request; and
process one or more commands received via the program path;
receive code via the program path, wherein the code is to include one or more of a runtime firmware image or a debug bootloader; and
store the code to non-volatile memory associated with the port controller.

20. The at least one non-transitory computer readable storage medium of claim 16, wherein the one or more commands are to include one or more of a reprogram command, a reset command or a diagnostic command.

* * * * *